US009224914B2

(12) United States Patent
Herner

(10) Patent No.: US 9,224,914 B2
(45) Date of Patent: Dec. 29, 2015

(54) INSULATING LAYER FOR PLANARIZATION AND DEFINITION OF THE ACTIVE REGION OF A NANOWIRE DEVICE

(71) Applicant: Glo AB, Lund (SE)

(72) Inventor: Scott Brad Herner, San Jose, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/306,563

(22) Filed: Jun. 17, 2014

(65) Prior Publication Data

US 2014/0367638 A1 Dec. 18, 2014

Related U.S. Application Data

(60) Provisional application No. 61/836,280, filed on Jun. 18, 2013.

(51) Int. Cl.
| | |
|---|---|
| H01L 21/00 | (2006.01) |
| H01L 29/06 | (2006.01) |
| H01L 27/15 | (2006.01) |
| H01L 33/06 | (2010.01) |
| H01L 33/00 | (2010.01) |
| H01L 21/02 | (2006.01) |
| H01L 33/24 | (2010.01) |
| H01L 33/18 | (2010.01) |

(52) U.S. Cl.
CPC .......... *H01L 33/06* (2013.01); *H01L 21/02271* (2013.01); *H01L 21/02343* (2013.01); *H01L 33/005* (2013.01); *H01L 33/24* (2013.01); *H01L 33/18* (2013.01)

(58) Field of Classification Search
CPC . H01L 33/06; H01L 33/0075; H01L 33/0025; H01L 33/32; H01L 33/24; H01L 33/18; H01L 33/46; H01L 33/62; H01L 29/413; H01L 29/068; H01L 29/0676
USPC ............ 438/22, 24, 28, 29, 34, 44; 257/9, 13, 257/14, 81, 82, 91, 99
See application file for complete search history.

(56) References Cited

U.S. PATENT DOCUMENTS

| 8,350,251 B1 * | 1/2013 | Lowgren et al. ................. 257/13 |
| 2008/0277676 A1 | 11/2008 | Hong et al. |

(Continued)

FOREIGN PATENT DOCUMENTS

| JP | 4058937 B2 | 3/2008 |
| KR | 10-2010-0051970 A | 5/2012 |

OTHER PUBLICATIONS

International Search Report and Written Opinion received in connection with international application No. PCT/US2014/042649, issued Oct. 16, 2014.

*Primary Examiner* — Hsien Ming Lee
(74) *Attorney, Agent, or Firm* — The Marbury Law Group PLLC

(57) ABSTRACT

Various embodiments include methods of fabricating a semiconductor device that include forming a plurality of nanowires on a support, wherein each nanowire comprises a first conductivity type semiconductor core and a second conductivity type semiconductor shell over the core, forming an insulating material layer over at least a portion of the plurality of nanowires such that at least a portion of the insulating material layer provides a substantially planar top surface, removing a portion of the insulating material layer to define an active region of nanowires, and forming an electrical contact over the substantially planar top surface of the insulating material layer.

25 Claims, 9 Drawing Sheets

(56) References Cited

U.S. PATENT DOCUMENTS

| | | |
|---|---|---|
| 2011/0163292 A1 | 7/2011 | Wang et al. |
| 2011/0309382 A1 | 12/2011 | Lowgren et al. |
| 2013/0341658 A1* | 12/2013 | Lee et al. .................. 257/91 |

* cited by examiner

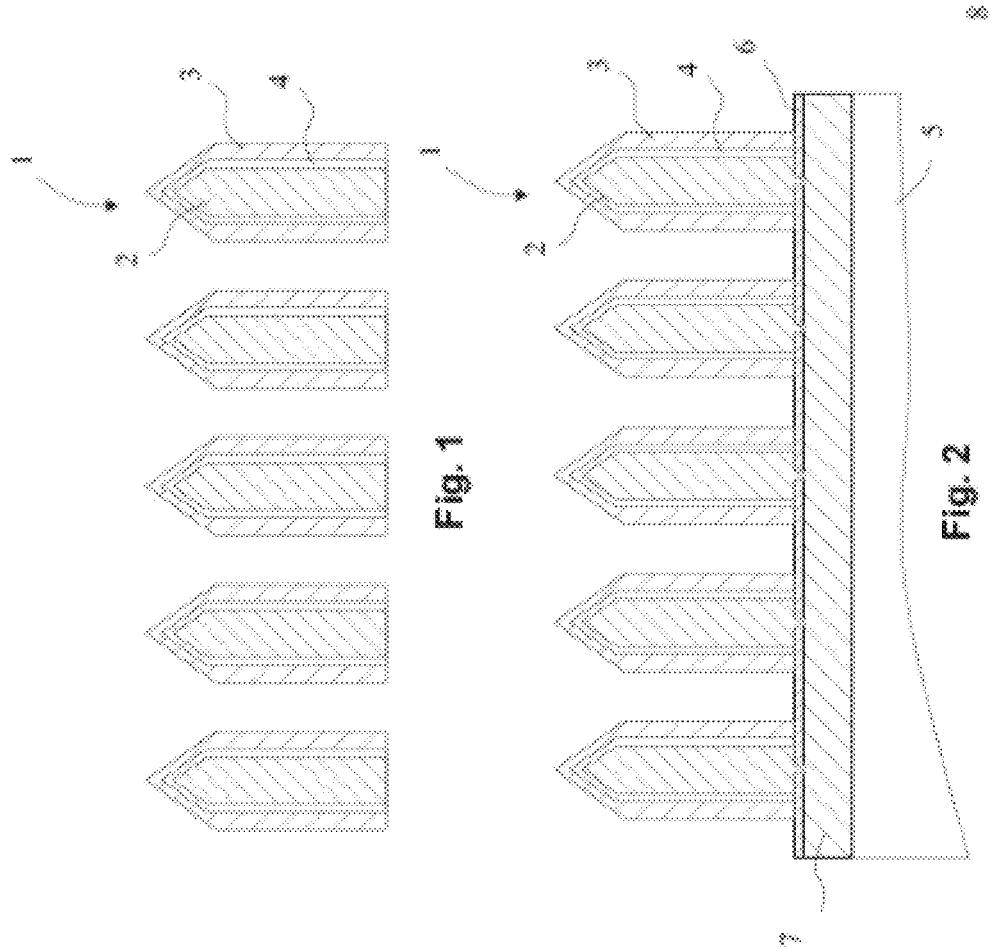

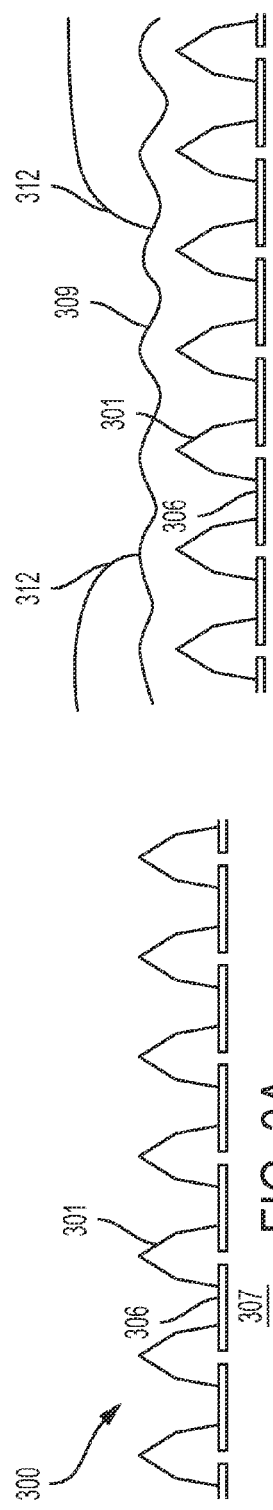
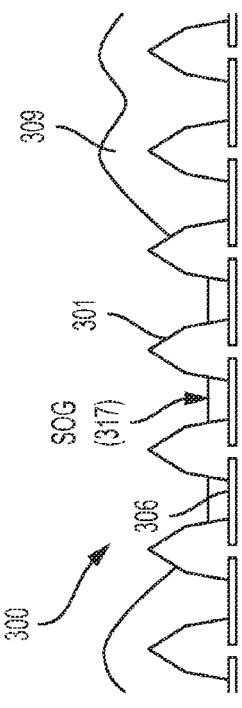
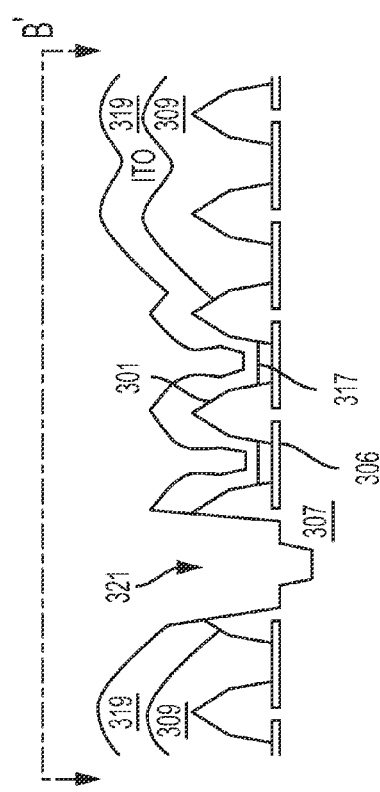
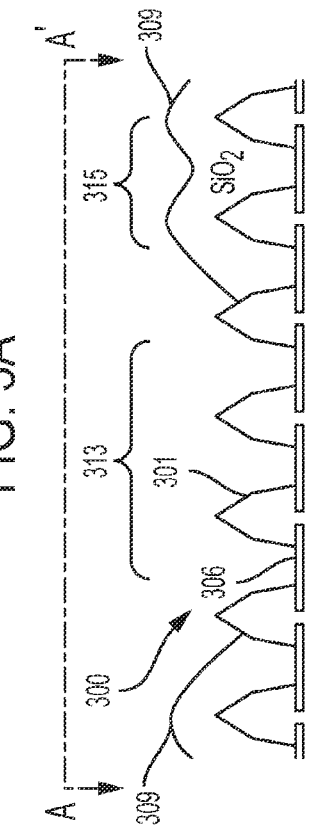
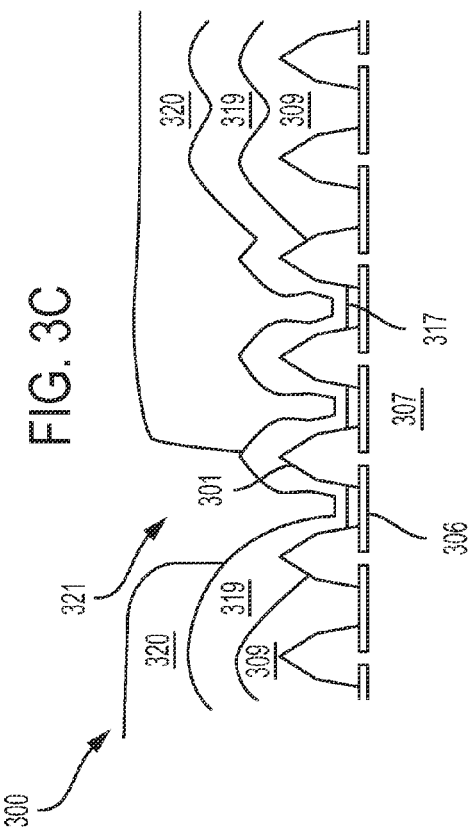

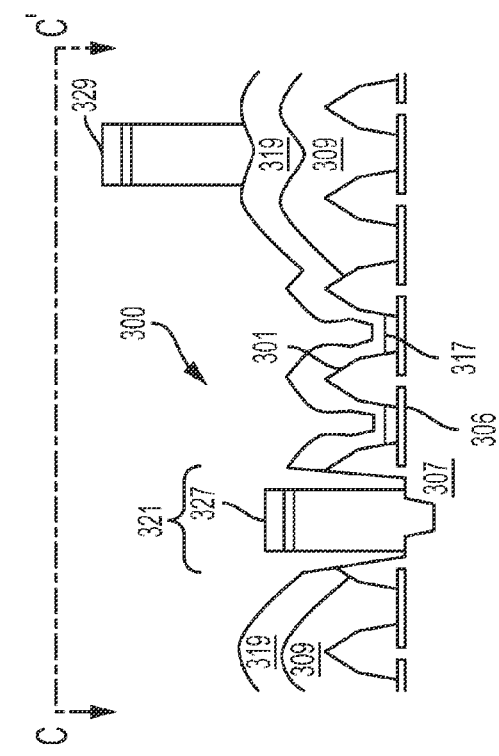
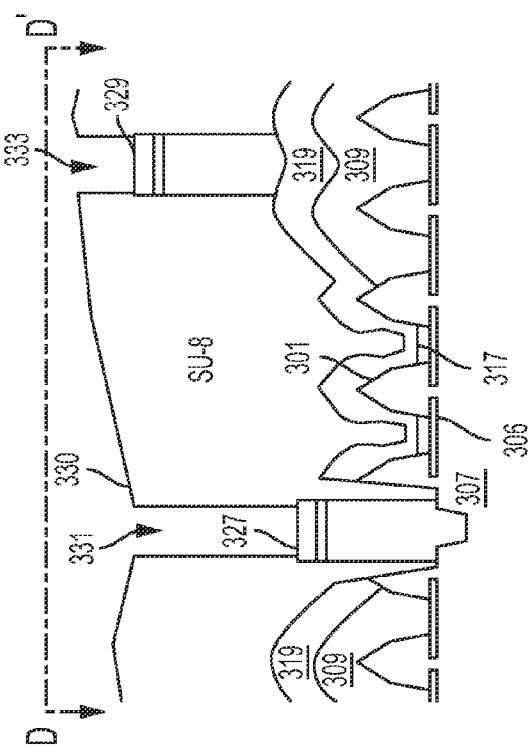
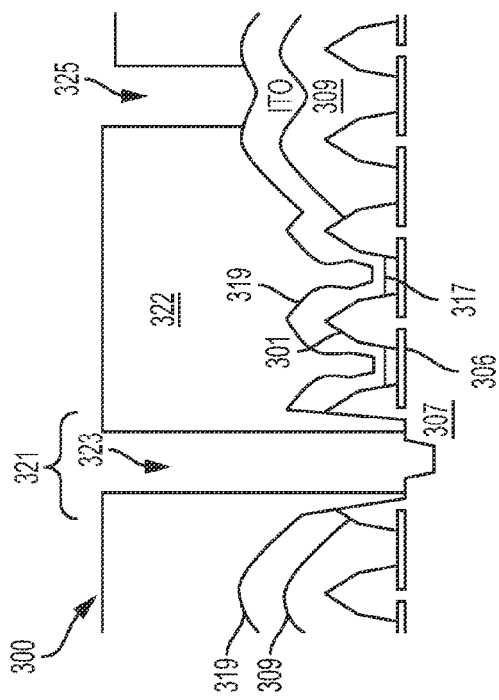
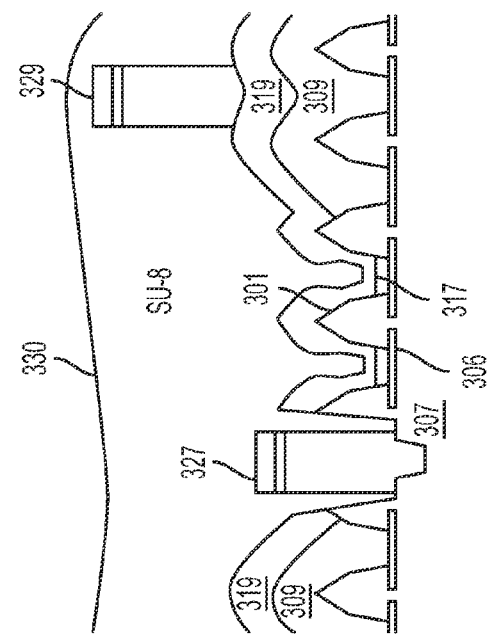

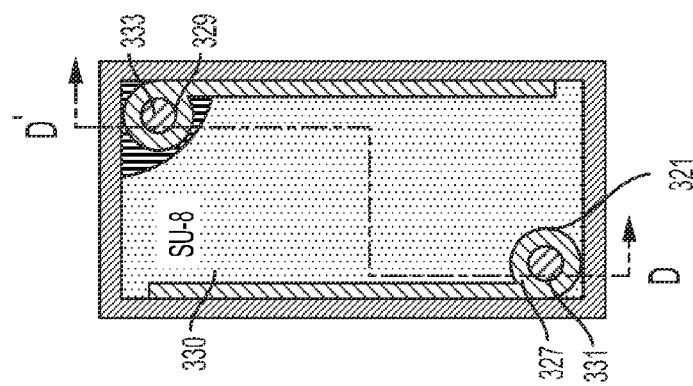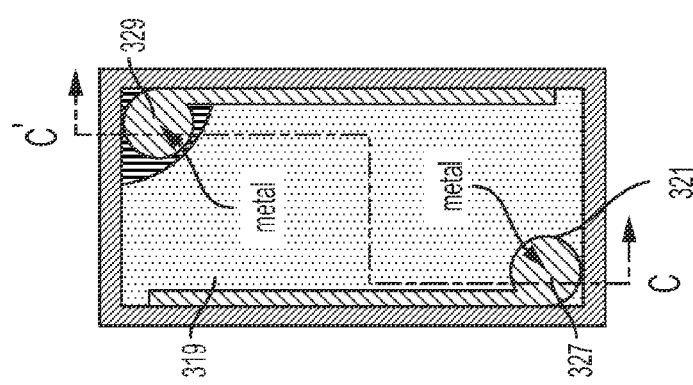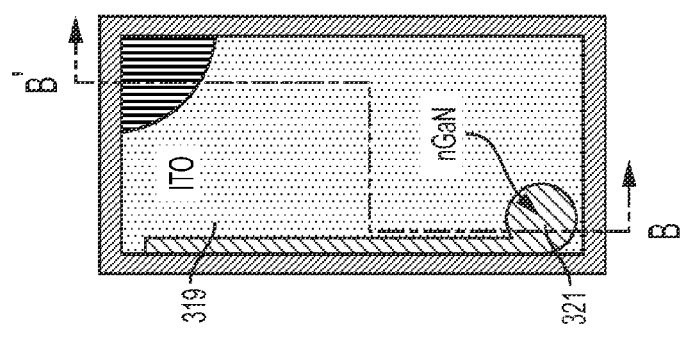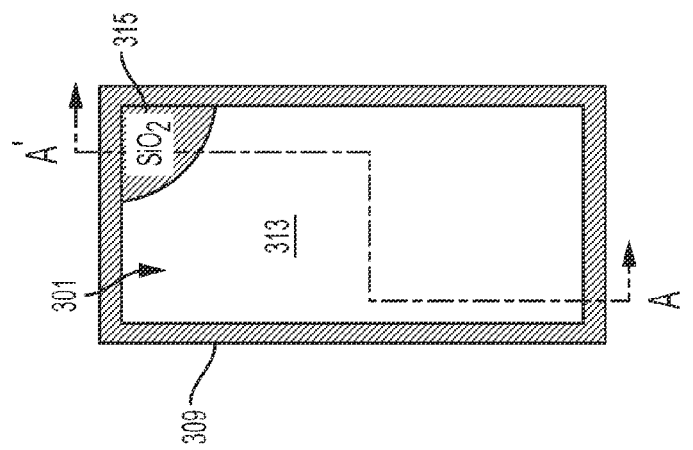

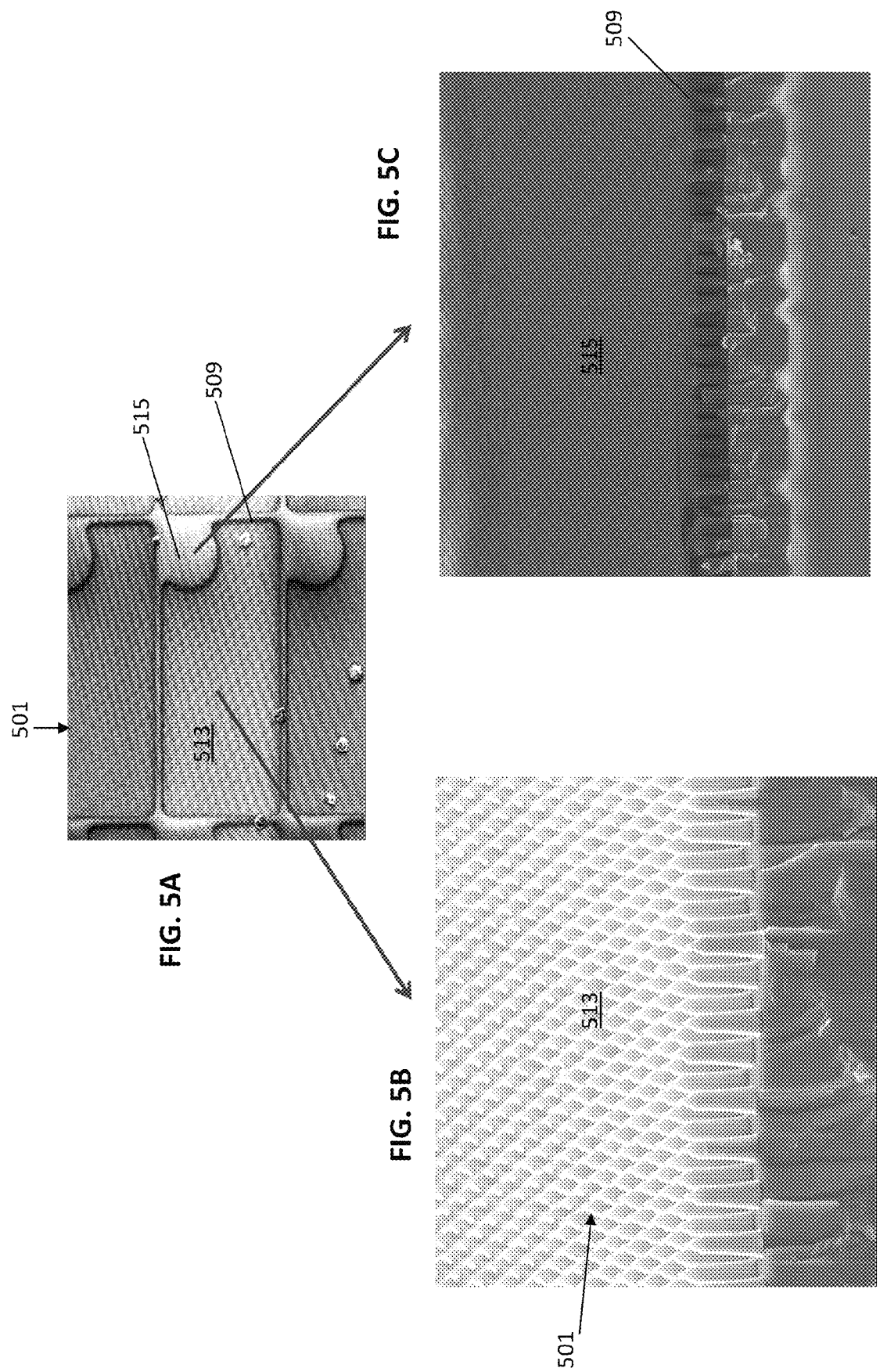

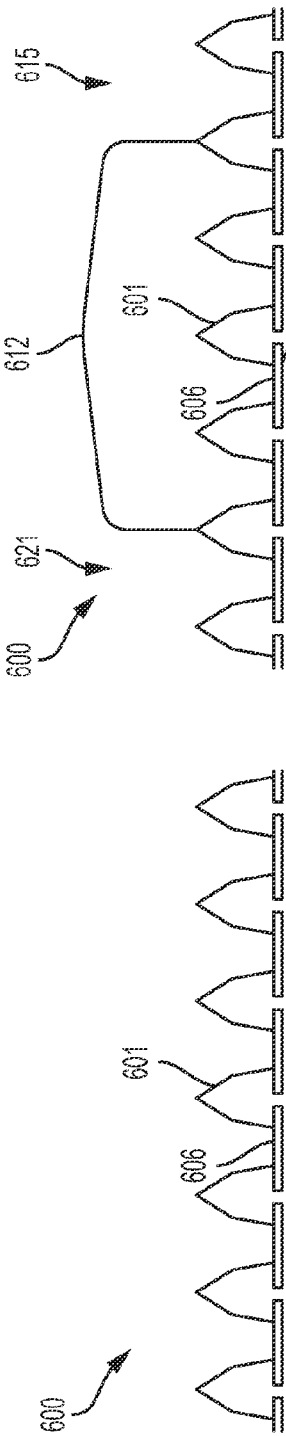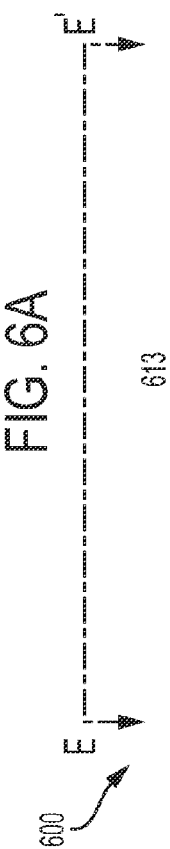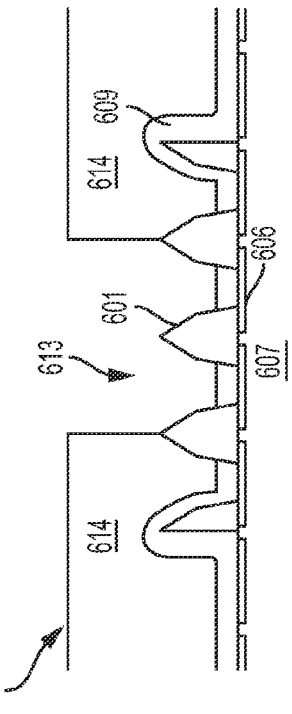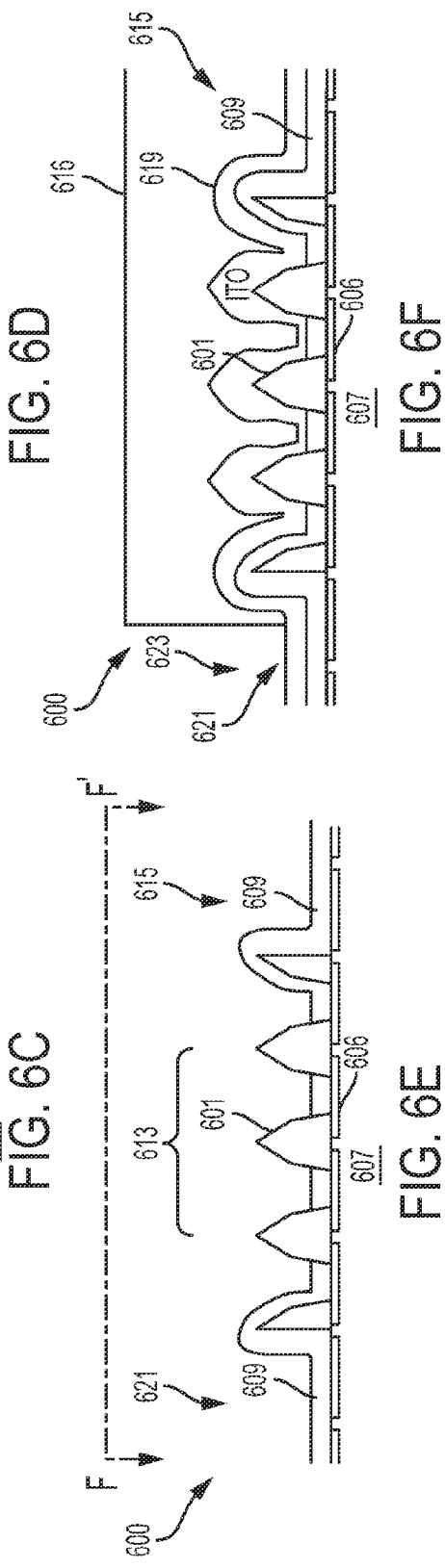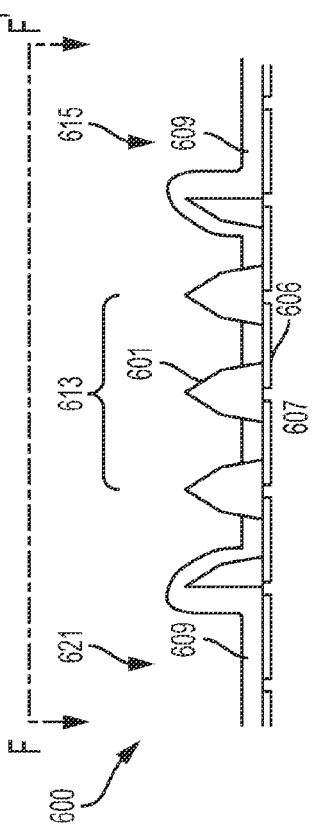

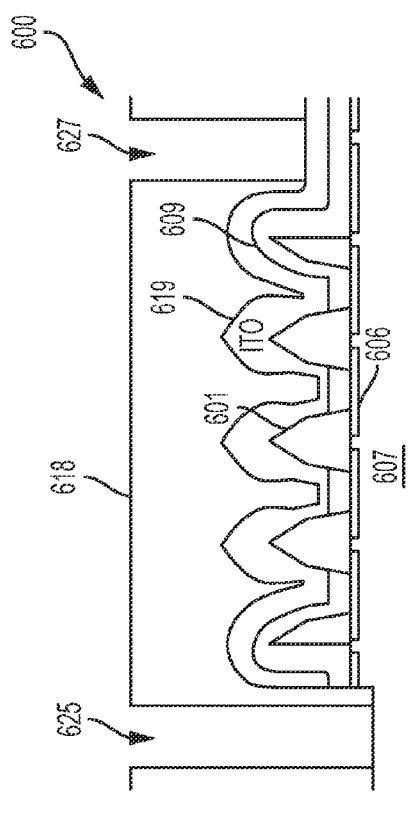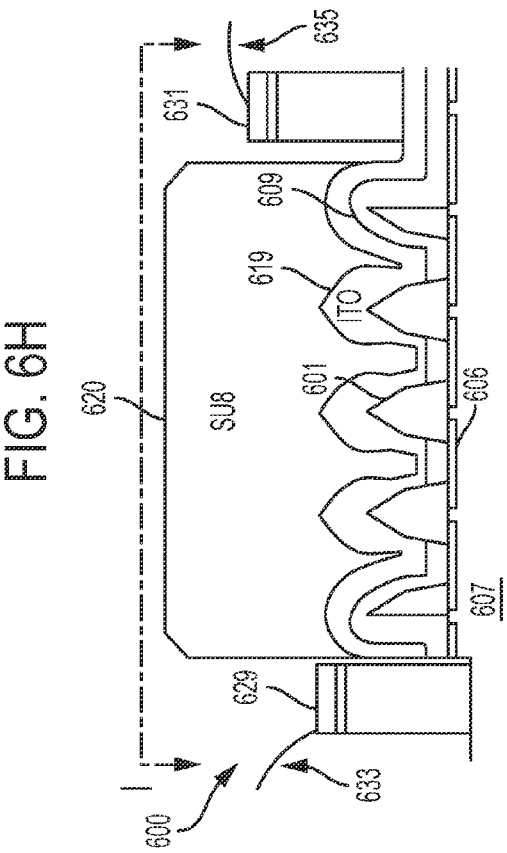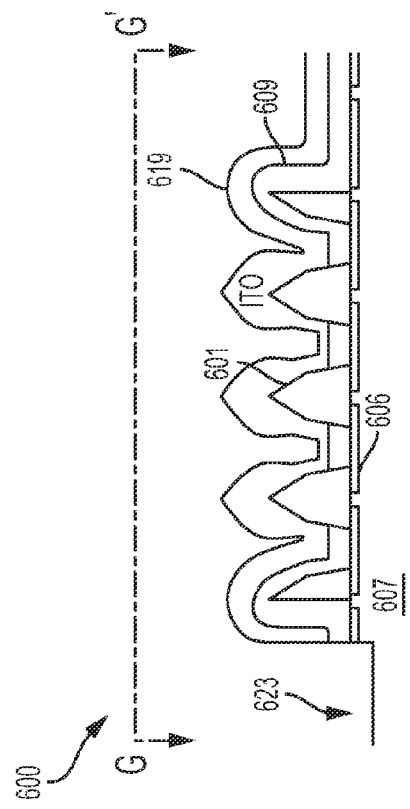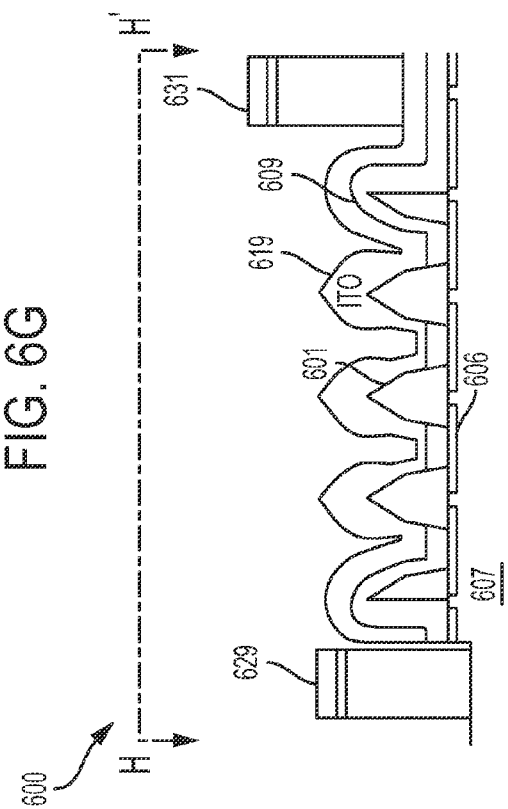

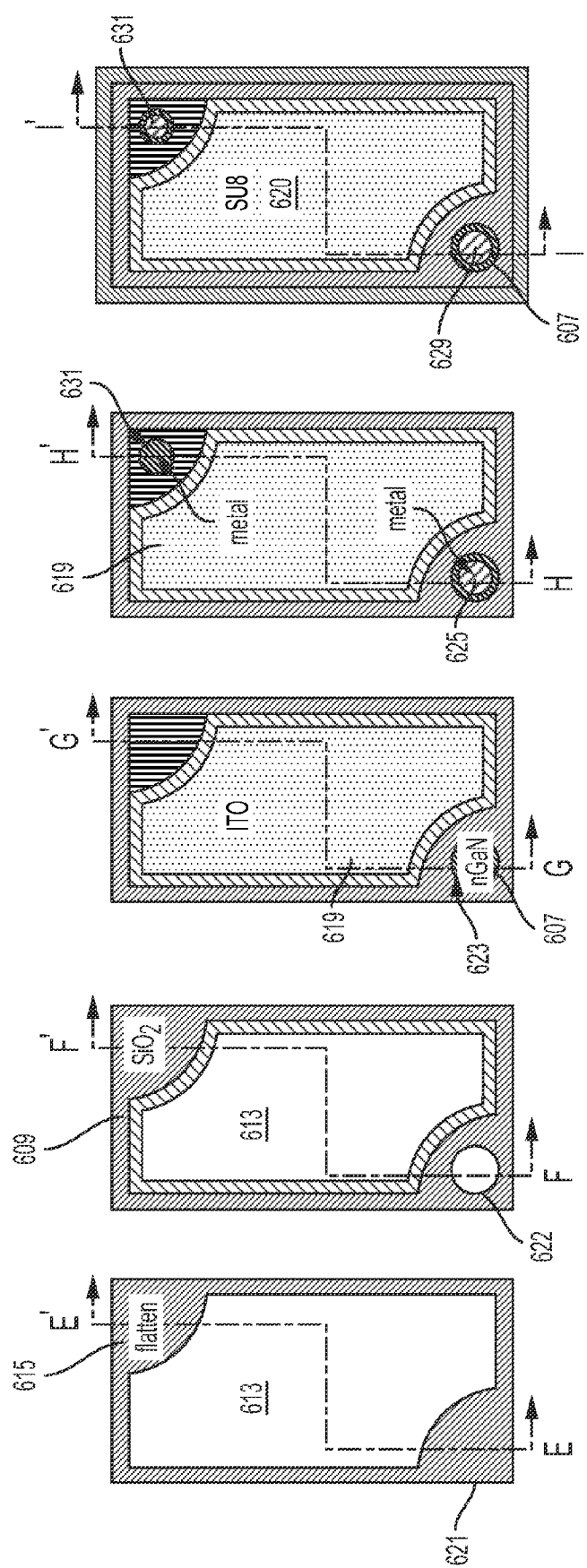

INSULATING LAYER FOR PLANARIZATION AND DEFINITION OF THE ACTIVE REGION OF A NANOWIRE DEVICE

CROSS REFERENCE TO RELATED APPLICATION

This application claims the benefit of priority to U.S. Provisional Patent Application Ser. No. 61/836,280 entitled "Insulating Layer for Planarization and Definition of the Active Region of a Nanowire Device" filed Jun. 18, 2013, which is incorporated herein by reference in its entirety.

BACKGROUND

Nanowire light emitting diodes (LED) are of increasing interest as an alternative to planar LEDs. In comparison with LEDs produced with conventional planar technology, nanowire LEDs offer unique properties due to the three-dimensional nature of the nanowires, improved flexibility in materials combinations due to less lattice matching restrictions and opportunities for processing on larger substrates.

SUMMARY

Embodiments include a method of fabricating a semiconductor device that includes forming a plurality of nanowires on a support, wherein each nanowire comprises a first conductivity type semiconductor core and a second conductivity type semiconductor shell over the core, forming an insulating material layer over at least a portion of the plurality of nanowires such that at least a portion of the insulating material layer provides a substantially planar top surface, removing a portion of the insulating material layer to define an active region of nanowires, and forming an electrical contact over the substantially planar top surface of the insulating material layer.

Further embodiments include a semiconductor device that includes a plurality of nanowires on a support, wherein each nanowire comprises a first conductivity type semiconductor core and a second conductivity type semiconductor shell over the core, an insulating material layer that forms a boundary around the plurality of nanowires to define an active region of nanowires, the insulating material layer having a substantially planar top surface, and an electrical contact over the substantially planar top surface of the insulating material layer.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

FIG. 1 schematically illustrates a side cross sectional view of a basis of a nanowire LED device in accordance with embodiments of the invention.

FIG. 2 schematically illustrates a side cross sectional view of a basis of a nanowire LED device on a buffer layer in accordance with embodiments of the invention.

FIGS. 3A-3J schematically illustrate side cross sectional views of a first process for fabricating a nanowire LED array having an insulating layer for planarizing and defining an active region according to one embodiment.

FIGS. 4A-4D are top views of a nanowire LED device schematically illustrating the fabrication process of FIGS. 3A-3J.

FIGS. 5A-5C are SEM images of a nanowire array with a patterned insulating layer for planarizing and defining an active region according to one embodiment.

FIGS. 6A-6J schematically illustrate side cross sectional views of a second process for fabricating a nanowire LED array having an insulating layer for planarizing and defining an active region according to yet another embodiment.

FIGS. 7A-7E are top views of a nanowire LED device schematically illustrating the fabrication process of FIGS. 6A-6J.

DETAILED DESCRIPTION

Figure 8C:
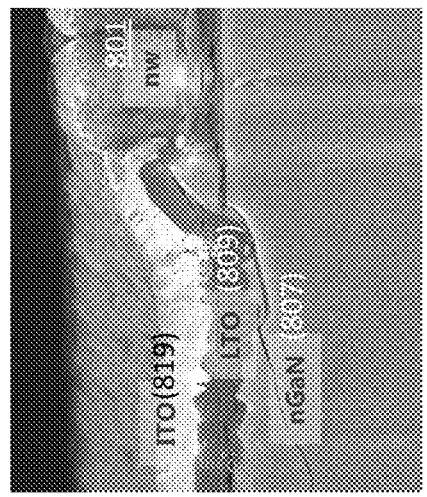
FIGS. 8A-8C are SEM images of a nanowire array with a patterned insulating layer for planarizing and defining an active region according to yet another embodiment.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The embodiments of the invention are directed generally to methods of fabricating nanowire semiconductor devices, such as nanowire LED devices, that include forming an insulating layer on a nanowire array to planarize the array, and removing a portion of the insulating layer to define an active region of a nanowire device. Further embodiments are directed to nanowire devices fabricated in accordance with the embodiment methods. The various embodiments may provide a nanowire device with planarized bond pad areas with fewer process steps and a larger active region than can be accomplished using a conventional dry etch active region definition.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. The nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure.

All references to upper, top, lower, downwards etc. are made as considering the substrate being at the bottom and the nanowires extending upwards from the substrate. Vertical refers to a direction perpendicular to the plane formed by the substrate, and horizontal to a direction parallel to the plane formed by the substrate. This nomenclature is introduced for the easy of understanding only, and should not be considered as limiting to specific assembly orientation etc.

Any suitable nanowire LED structure as known in the art may be used in the methods of the invention. Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

FIG. 1 schematically illustrates the basis for a nanowire LED structure that is modified in accordance with embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being made up from nanowire LEDs 1 having an n-type nanowire core 2 and a p-type shell 3 at least partly enclosing the nanowire core 2 and an intermediate active region 4, which may comprise a single intrinsic or lightly doped (e.g., doping level below $10^{16}$ cm$^{-3}$) semiconductor layer or one or more quantum wells, such as 3-10 quantum wells comprising a plurality of semiconductor layers of different band gaps. However, for the purpose of embodiments of the invention nanowire LEDs are not limited to this. For example the nanowire core 2, the active region 4 and the p-type shell 3 may be made up from a multitude of layers or segments. In alternative embodiments, only the core 2 may comprise a nanostructure or nanowire by having a width or diameter below 2 micron, while the shell 3 may have a width or diameter above one micron.

The III-V semiconductors are of particular interest due to their properties facilitating high speed and low power electronics and optoelectronic devices such as lasers and LEDs. The nanowires can comprise any semiconductor material, and suitable materials for the nanowire include but are not limited to: GaAs(p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$ cm$^{-3}$. A person skilled in the art is though familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductor (e.g., InP, GaAs). In order to function as a LED, the n-side and p-side of each nanowire LED 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified by the "pyramid" facets and the vertical sidewall facets. The LEDs can be fabricated so that the emission layer formed on templates with dominant pyramid facets or sidewall facets. The same is true for the contact layer, independent of the shape of the emission layer.

FIG. 2 illustrates an exemplary structure that provides a support for the nanowires. By growing the nanowires on a growth substrate 5, optionally using a growth mask, or dielectric masking layer, 6 (e.g., a nitride layer, such as silicon nitride dielectric masking layer) to define the position and determine the bottom interface area of the nanowires, the substrate 5 functions as a carrier for the nanowires that protrude from the substrate 5, at least during processing. The bottom interface area of the nanowires comprises the root area of the core 2 inside each opening in the dielectric masking layer 6. The substrate 5 may comprise different materials, such as III-V or II-VI semiconductors, Si, Ge, Al$_2$O$_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowire cores 2 are grown directly on the growth substrate 5.

Preferably, the substrate 5 is also adapted to function as a current transport layer connecting to the n-side of each nanowire LED 1. This can be accomplished by having a substrate 5 that comprises a semiconductor buffer layer 7 arranged on the surface of the substrate 5 facing the nanowire LEDs 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein.

It should be noted that the nanowire LEDs 1 may comprise several different materials (e.g., GaN core, GaN/InGaN multiple quantum well active region and AlGaN shell having a different Al to Ga ratio than the active region). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The use of sequential (e.g., shell) layers gives that the final individual device (e.g., a pn or pin device) may have a shape anywhere between a pyramid or tapered shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 2 micron, and heights ranging from a few 100 nm to several (e.g., 10) μm.

The above description of an exemplary embodiment of a LED structure will serve as a basis for the description of the methods and compositions of the invention; however, it will be appreciated that any suitable nanowire LED structure or other suitable nanowire structure may also be used in the methods and compositions, with any necessary modifications as will be apparent to one of skill in the art, without departing from the invention.

Nanowire LEDs, such as GaN-based nanowire LEDs, show promise in increasing the efficiency and wavelength stability compared to planar LEDs. However, the three-dimensional nature of nanowires can pose challenges in fabrication, notably the wire bonding step where the LED device (i.e., chip) is connected to an external current/voltage source. The wire bonding step involves application of mechanical pressure and vibration from the wire to the device. This pressure and vibration of the wire bonding process can break nanowires due to the leverage from the pressure point at the top of the wire to the weak small nucleation base of the nanowire. Therefore, in areas where a wire will be bonded to the device, it is desirable to planarize the area to avoid developing a lever arm that can break the nanowires.

The fabrication process of a nanowire LED typically also involves defining the active region of a device. This is usually accomplished by a dry etch of a nearly-completed device, which results in a break in the continuity of either the n- or p-side conductive layers, resulting in isolated devices. Alternatively, the nanowires may be etched prior to conductive film deposition (e.g., the top electrode or contact deposition) to define the active region. However, if nanowires are etched prior to conductive film deposition, there will typically be some nanowires that are partially etched, requiring the deposition of a passivating film prior to depositing the conductive film to avoid shorting the exposed p-n junction. This passivation film must be separately masked and etched, which then consumes some of the active region to allow for the transition region to be sufficiently isolated from conductive film deposition.

Various embodiments include methods for fabricating nanowire semiconductor devices, such as nanowire LED devices, that include forming an insulating layer, such as a low temperature oxide (LTO) layer, on a nanowire array to planarize the array, and removing a portion of the insulating layer, such as by wet etching through a patterned mask, to define an active region of a nanowire device. Further embodiments are directed to nanowire devices fabricated in accordance with the embodiment methods. The various embodiments may provide a nanowire device with planarized bond pad areas with fewer process steps and a larger active region than can be accomplished using a conventional dry etch active region definition.

A first embodiment method for fabricating a nanowire device is schematically illustrated in FIGS. 3A-3J and 4A-4D. FIG. 3A schematically illustrates a nanowire LED device 300 that includes a plurality of nanowires 301, which may be similar to the nanowires shown in FIGS. 1 and 2. The nanowires 301 may be on a support substrate including a buffer layer 307 of a first conductivity type (e.g., n-type) and a dielectric masking layer 306 (e.g., SiN layer). The nanowires 301 may each comprise a nanowire core of a first conductivity type (e.g., n-type), a shell of a second conductivity type (e.g., p-type), and an intermediate light-generating active region, as described above in connection with FIGS. 1 and 2. The nanowire cores may be in electrical contact with the buffer layer 307, and the nanowire shells may be insulated from the buffer layer by the dielectric masking layer 306.

In some embodiments, conditions during or after creation of the nanowires 301 may be controlled such that the conductivity of a tip portion of the nanowires is reduced by at least one order of magnitude compared to the conductivity of the tips without the controlling of the conditions, as described in U.S. Provisional Application No. 61/719,133, filed on Oct. 26, 2012, which is incorporated herein by reference. This may inhibit current leakage through the outer shell of the nanowire, particularly through at the tip portion of the nanowire, where the outer shell may be thinner as compared to along the sidewalls of the nanowire. The conductivity of the tips may be reduced by depositing an insulating material, such as $Al_2O_3$, on the tips. Alternatively or in addition, the conductivity of the tips may be reduced by directing a material to the tips, such as $H_2^+$ and/or $Ar^+$ ions, that render the tips nonconductive or less conductive. Angled deposition techniques for selectively directing materials to the tip portions of nanowire structures are disclosed in U.S. Provisional Application No. 61/718,884, filed on Oct. 26, 2012, which is incorporated herein by reference.

In FIG. 3B, a dielectric (i.e., insulator) layer 309 is formed over the plurality of nanowires 301. The dielectric layer 309 may be a $SiO_2$ layer and may be formed by low temperature oxide (LTO) deposition. LTO deposition may be accomplished by chemical vapor deposition (CVD) at low temperature (e.g., less than 750° C., such as 300-600° C., including 400-500° C., or about 450° C.), and at sub-atmospheric pressure, such as 10 Torr or less (e.g., $10^{-6}$ Torr to 1 Torr, such as 100-500 mTorr, including about 450 mTorr), with flows of $SiH_4$ and $O_2$. The $O_2$ flow may be in excess of the $SiH_4$ flow in standard cubic cm per minute (sccm). Typical flow rates may be, for example, 85 sccm $SiH_4$ and 120 sccm $O_2$. Other insulating materials, such as SiN, SiON, $Al_2O_3$, etc., may also be used.

The dielectric layer 309 may be deposited with an average thickness of 0.5-5 μm (e.g., 1-2 μm, such as about 1.5 μm) over the nanowire array. The dielectric layer 309 may cover the nanowires 301 to provide a generally planar top surface of the device 300 (i.e., as compared to the non-planar, three-dimensional geometry of the nanowire array). A first mask layer 312, which may be a photoresist layer, is formed over the generally planar top surface of the dielectric layer 309. The first mask layer 312 may be patterned using standard lithographic techniques to define an opening in the first mask layer 312.

The first mask layer 312 is patterned to define an exposed active region 313 of the device 300 and at least one bond region 315 of the device (covered by the mask 312 pattern). The device 300 may then be etched to transfer the pattern of the first mask layer 312 to the dielectric layer 309. In embodiments, the dielectric layer 309, which may be $SiO_2$, may be etched using a wet etch of diluted hydrofluoric acid (HF) to remove select portions of the dielectric layer 309. A typical concentration for a wet etch solution may be, for example, 1 part HF to 3 parts $H_2O$. A HF etch may remove select portions of dielectric layer 309 while leaving the nanowires 301 undisturbed.

After etching, the mask layer 312 may be removed to provide the device 300 shown in FIG. 3C. FIG. 4A is a top view of the device 300 illustrating the device 300 after etching and removal of the first mask layer 312. Line A-A' in FIG. 4A corresponds to line A-A' in FIG. 3C, though the device 300 is not necessarily shown to scale. The region of the device 300 where the dielectric layer 309 has been removed defines an active region 313 of the device 300. The dielectric layer 309 may extend around a periphery of the active region 313 to define the boundary of the active region 313, as shown in FIG. 4A. A generally planar portion of the dielectric layer 309 may define a bond region 315 of the device 300. As shown in FIG. 4A, for example, the bond region 315 is located in the upper right hand corner of the device.

An optional dielectric layer 317 may be formed over the active region 313 of the device, as shown in FIG. 3D. The dielectric layer 317 can be deposited by spin on methods, chemical vapor deposition, or physical vapor deposition. The preferred method is spin on deposition of glass ($SiO_2$), also known as spin on glass, or SOG, followed by isotropic etching (e.g., HF etch) to remove SOG from the nanowire 301 side walls. In one preferred embodiment, the nanowires are about 2.5 μm tall, the dielectric layer 317 is about 1000-about 6000 Å thick, most preferably about 3000 Å as measured on the planar surface at the bottom. The dielectric layer 317 may electrically isolate the "foot" area at the base of the nanowires to inhibit leakage current, as described in U.S. Provisional Application No. 61/832,309, filed Jun. 7, 2013, which is incorporated herein by reference. A portion of layer 371 may remain above layer 309 after the etch (not shown in FIG. 3D). If desired, layer 317 may be omitted.

A transparent conductive oxide (TCO) layer 319, such as indium tin oxide (ITO) is deposited over the device 300, as shown in FIG. 3E. The TCO layer 319 may contact the p-type shells of the nanowires 301 to form a p electrode layer. Other TCO materials such as aluminum doped zinc oxide can also be used. The TCO layer 319 may be deposited by physical methods such as evaporation or sputtering, by CVD, or by a combination of methods. In some embodiments, the layer 319 may be deposited by a sputtering method that preferably does not damage the p-type nanowire shells. The ITO layer 319 can be about 100 Å to about 10,000 Å thick, most preferably about 8,000 Å. In some embodiments, the TCO layer 319 may be deposited using a two-step method, including evaporation followed by sputtering, as disclosed in U.S. Provisional Application No. 61/787,299, filed on Mar. 15, 2013, which is incorporated herein by reference.

A second mask layer 320, which may be a photoresist layer, is formed over the TCO layer 319 and may be patterned using standard lithographic techniques to define an opening 321 in the second mask layer 320, as shown in FIG. 3E. The second mask layer 320 is patterned to define an n-side contact area 321 of the device 300 (i.e., the n-side contact area 321 is exposed by the mask layer 320 and the rest of the device is covered by the mask layer 320). The device 300 may then be etched to transfer the pattern of the second mask layer 320 to the device 300. The etching may stop at or in the buffer layer 307 of the device 300 to expose then n-type buffer layer material in the n-side contact area 321. The etch may be a dry etch or a wet etch. In one embodiment, a dry etch is used, such as an inductively coupled plasma (ICP) etch, which may utilize a chlorine gas plasma. Chlorine will etch $SiO_2$, ITO, and GaN. Following the etch, the second mask layer 320 is removed to provide the device 300 as shown in FIG. 3F. FIG. 4B is a top view of the device 300 after etching and removal of the patterned second mask layer 320. Line B-B' in FIG. 4B corresponds to line B-B' in FIG. 3F, though the device 300 is not necessarily shown to scale. As shown in FIG. 4B, for example, the n-side contact area 321 may be located in the lower left hand corner of the device 300, diagonally opposite the p-side bond region 315.

A third mask layer 322, which may be a photoresist layer, is formed over the device 300 and may be patterned using standard lithographic techniques to provide a first opening 323 over the n-side contact area 321, and a second opening 325 over the p-side bond region 315, as shown in FIG. 3G. The openings 323, 325 in the third mask layer 322 define the locations for the n- and p-metal contacts, respectively. The opening 323 for the n-side metal contact may be smaller than the n-side contact area 321 to isolate the n-side metal contact from the exposed TCO layer 319 and any partially-etched nanowires 301. A metal contact stack, which can include Al, Ti, and Au, may then be deposited by evaporation over the third mask layer 322 and within the openings 323, 325. The metal stack may be deposited with a thickness of 1-10 μm (e.g., 2-4 μm, such as about 3.3 μm). The metal contact stack may be deposited in the order of aluminum first and gold last, with gold being the film on the surface, where gold does not require thermal processing to make a good ohmic contact. The third photoresist mask 322 with the deposited metal is then removed (e.g., lifted off the device) to leave n- and p-metal contacts 327, 329 on the device 300 as shown in FIG. 3H. P-side contact 329 contacts TCO layer 319 in 315 over layer 309. FIG. 4C is a top view of the device 300 after deposition of the n- and p-metal contacts 327, 329 and removal (e.g., lift off) of the patterned third mask layer 322. Line C-C' in FIG. 4C corresponds to line C-C' in FIG. 3H, though the device 300 is not necessarily shown to scale.

A fourth mask layer 330 may then be formed over the device 300, as shown in FIG. 3I. The fourth mask layer 330 may be a photosensitive material, such as an SU-8 epoxy, which may be used to passivate the device 300. The fourth mask layer 330 may have an average thickness of 5-25 μm (e.g., 10-20 μm, such as about 15 μm). The fourth mask layer 330 may be processed and developed using standard photolithography techniques to provide openings 331, 333 to access the n-metal and p-metal contacts (i.e., electrodes) 327, 329, respectively, as shown in FIG. 3J. FIG. 4D is a top view of the device 300 illustrating the fourth mask layer 330 and openings 331, 333. Line D-D' in FIG. 4D corresponds to line D-D' in FIG. 3J, though the device 300 is not necessarily shown to scale.

A net result of the above-described process is a device 300 with planarized bonding areas that may be produced with fewer process steps and a larger active region than is achievable through conventional fabrication techniques, such as by methods that define the active region via dry etching through a substantially-completed device. Bonding wires may then be attached to the respective n-metal and p-metal contacts 327, 329 through openings 331, 333.

FIGS. 5A-C are scanning electron microscope (SEM) images of a nanowire array 501 having a patterned dielectric layer 509, which may be a low temperature oxide (LTO), such as $SiO_2$, formed over the array 501. As shown in FIG. 5A, the dielectric layer 509 may isolate portions of the array 501 into discrete active regions 513. The active regions 513 may be substantially free of the dielectric material, as shown in FIG. 5B. The dielectric layer 509 may also provide a planarized bond region 515, insulated from the array 501, as shown in FIG. 5C, that can be used to form a contact pad for a nanowire device.

A second embodiment method for fabricating a nanowire device is schematically illustrated in FIGS. 6A-6J and 7A-7E. FIG. 6A schematically illustrates a nanowire LED device 600 that includes a plurality of nanowires 601, a buffer layer 607 and a dielectric masking layer 606 (e.g., SiN layer), as described above in connection with FIG. 3A. The nanowires 601 may each comprise a nanowire core of a first conductivity type (e.g., n-type), a shell of a second conductivity type (e.g., p-type), and an intermediate light-generating active region, as described above in connection with FIGS. 1 and 2. The nanowire cores may be in electrical contact with the buffer layer 607, and the nanowire shells may be insulated from the buffer layer by the dielectric masking layer 606, as described above.

In FIG. 6B, a first mask layer 612, which may be a photoresist layer, is formed over the nanowires 301. The first mask layer 612 may be patterned using standard lithographic techniques to cover the nanowires 601 in an active region 613 of the device 600, and to define exposed regions 621, 615. The device 600 may be etched to transfer the pattern of the first mask layer 612 to the device 600. The etch may be a dry etch (e.g., an inductively coupled plasma (ICP) etch), which may utilize a chlorine gas plasma. The exposed nanowires 601 are removed to "flatten" the device in regions 615 and 621, as shown in FIG. 6C, as described in U.S. Provisional Application No. 61/836,296, filed on Jun. 18, 2013, which is incorporated herein by reference. These "flattened" regions may later be used to form electrical contacts, as described below. Following the etch, the first mask layer 612 is removed to provide the device 600 as shown in FIG. 6C. FIG. 7A is a top view of the device 600 after etching and removal of the patterned first mask layer 612. Line E-E' in FIG. 7A corresponds to line E-E' in FIG. 6C, though the device 600 is not necessarily shown to scale.

In FIG. 6D, a dielectric layer 609 is formed over the device, including over the nanowires 601 in active region 613 and over the "flattened" regions 615, 621 in which the nanowires have been removed. The dielectric layer 609 may be a $SiO_2$ layer and may be formed by low temperature oxide (LTO) deposition. LTO deposition may be accomplished by chemical vapor deposition (CVD) at low temperature (e.g., less than 750° C., such as 300-600° C., including 400-500° C., or about 450° C.), and at sub-atmospheric pressure, such as 10 Torr or less (e.g., $10^{-6}$ Torr to 1 Torr, such as 100-500 mTorr, including about 450 mTorr), with flows of $SiH_4$ and $O_2$. The $O_2$ flow may be in excess of the $SiH_4$ flow in standard cubic cm per minute (sccm). Typical flow rates may be, for example, 85 sccm $SiH_4$ and 120 sccm $O_2$.

The dielectric layer 609 may be deposited with an average thickness of 0.01-10 µm (e.g., 0.1 to 1 µm, such as about 0.4 µm) over the device 600. A second mask layer 614, which may be a photoresist layer, is formed over the dielectric layer 609. The second mask layer 614 may be patterned using standard lithographic techniques to define an opening in the second mask layer 614 corresponding with the active region 613 of the device 300. The device 300 may then be etched to transfer the pattern of the second mask layer 614 to the dielectric layer 609. In embodiments, the dielectric layer 609, which may be $SiO_2$, may be etched using a wet etch of diluted hydrofluoric acid (HF) to remove the dielectric layer 609 from the active region 613 of the device. A typical concentration for a wet etch solution may be, for example, 1 part HF to 3 parts $H_2O$. A HF etch may remove select portions of dielectric layer 609 while leaving the nanowires 601 in the active region 613 undisturbed.

After etching, the second mask layer 614 may be removed to provide the device 600 shown in FIG. 6E. FIG. 7B is a top view of the device 600 after etching and removal of the patterned second mask layer 614. Line F-F' in FIG. 7B corresponds to line F-F' in FIG. 6E, though the device 600 is not necessarily shown to scale. The dielectric layer 609 is removed from the active region 613 of the device 600. The dielectric layer 609 may extend around a periphery of the active region 613 to define the boundary of the active region 613, as shown in FIG. 7B. The dielectric layer 609 may provide a generally planar top surface over the "flattened" portions 615, 621 of the device 600, and may electrically isolate the top surface of the "flattened" portions 615, 621 from the rest of the device. (The circle 622 in FIG. 7B indicates the future location of the n-side contact 629, described below).

An acid clean may be performed of the device 600 and a transparent conductive layer 619, such as a transparent conductive oxide (TCO), for example an indium tin oxide (ITO) layer, may be deposited over the device 600, including over the nanowires 601 in the active region 613 and over the dielectric layer 609 in the "flattened" regions 621, 615, as shown in FIG. 6F. The TCO layer 619 may contact the p-type shells of the nanowires 301 to form a p electrode or contact layer. Other TCO materials such as aluminum doped zinc oxide (AZO) can also be used. The TCO layer 619 may be deposited by physical methods such as evaporation or sputtering, by CVD, or by a combination of methods. In some embodiments, the layer 619 may be deposited by a sputtering method that preferably does not damage the p-type nanowire shells. The ITO layer 619 can be about 100 Å to about 10,000 Å thick, most preferably about 8,000 Å. In some embodiments, the TCO layer 619 may be deposited using a two-step method, including evaporation followed by sputtering, as disclosed in U.S. Provisional Application No. 61/787,299, filed on Mar. 15, 2013, which is incorporated by reference herein.

A third mask layer 616, which may be a photoresist layer, is formed over the TCO layer 619 and may be patterned using standard lithographic techniques to define an opening 623 in the third mask layer 616, as shown in FIG. 6F. The opening 623 in the third mask layer 616 defines an n-side contact area 623 within the "flattened" portion 621 of the device 600. The device 600 may then be etched to transfer the pattern of the third mask layer 616 to the device 600. The etching may stop at or in the buffer layer 607 of the device 600 to expose then n-type buffer layer material in the n-side contact area 623 (e.g., form a "mesa" structure). The etch may be a dry etch or a wet etch. In one embodiment, a dry etch is used, such as an inductively coupled plasma (ICP) etch, which may utilize a chlorine gas plasma. Chlorine will etch $SiO_2$, ITO, and GaN. Following the etch, the third mask layer 616 is removed to provide the device 600 as shown in FIG. 6G. FIG. 7C is a top view of the device 600 after etching and removal of the patterned third mask layer 616. Line G-G' in FIG. 7C corresponds to line G-G' in FIG. 6O, though the device 600 is not necessarily shown to scale. As shown in FIG. 7C, for example, the n-side contact area 623 may be located in the "flattened" region in the lower left hand corner of the device 600.

A fourth mask layer 618, which may be a photoresist layer, is formed over the device 600 and may be patterned using standard lithographic techniques to provide a first opening 625 over the n-side contact area 621, and a second opening 627 over the "flattened" area 615, as shown in FIG. 6H. The openings 625, 627 in the fourth mask layer 618 define the locations for the n- and p-metal contacts, respectively. The opening 625 for the n-side metal contact may be smaller than the n-side contact area 623 to isolate the n-side metal contact from the exposed TCO layer 619 and any partially-etched nanowires 601. A metal contact stack, which can include Al, Ti, and Au, may then be deposited by evaporation over the fourth mask layer 618 and within the openings 625, 627. The metal stack may be deposited with a thickness of 1-10 µm (e.g., 2-4 µm, such as about 3.3 µm). The metal contact stack may be deposited in the order of aluminum first and gold last, with gold being the film on the surface, where gold does not require thermal processing to make a good ohmic contact.

The fourth mask layer 618 with the deposited metal is then removed (e.g., lifted off the device) to leave n- and p-metal contacts 629, 631 on the device 600 as shown in FIG. 6I. FIG. 7D is a top view of the device 600 after metal deposition and removal (e.g., lift off) of the patterned fourth mask layer 618. Line H-H' in FIG. 7D corresponds to line H-H' in FIG. 6I, though the device 600 is not necessarily shown to scale.

A fifth mask layer 620 may then be formed over the device 600, as shown in FIG. 6J. The fifth mask layer 620 may be a photosensitive epoxy material, such as an SU-8 epoxy-based photoresist, which may be used to passivate the device 600. The fifth mask layer 620 may have an average thickness of 5-25 μm (e.g., 10-20 μm, such as about 15 μm). The fifth mask layer 620 may be processed and developed using standard photolithography techniques to remove the fifth mask layer 620 from an area around the n-metal and p-metal electrodes 629, 631, as shown in FIG. 6J. The fifth mask layer 620 may remain over the active region of the device 600. FIG. 7E is a top view of the device 600 illustrating the fifth mask layer 620 and n-metal and p-metal electrodes 629, 631. Line I-I' in FIG. 7E corresponds to line I-I' in FIG. 6J, though the device 300 is not necessarily shown to scale. Wires 633, 635 may be bonded to the n-metal and p-metal electrodes 629, 631, as shown in FIG. 6J.

Figure 8B:
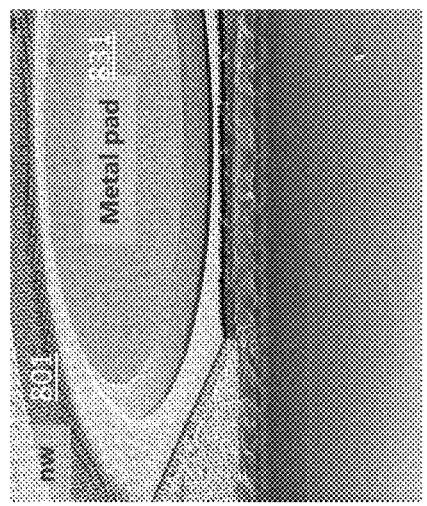
Figure 8A:
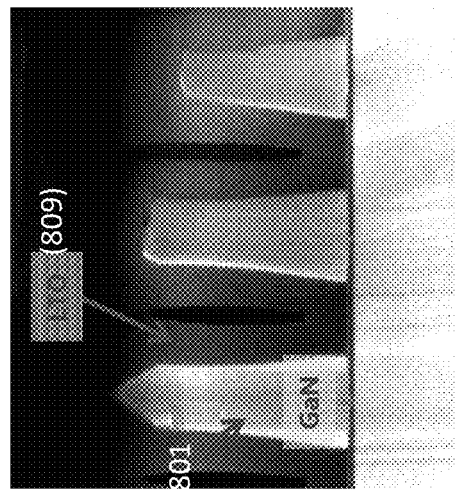

FIGS. 8A-C are scanning electron microscope (SEM) images of a GaN-based nanowire array 801 having a patterned dielectric layer 809, which may be a low temperature oxide (LTO), such as $SiO_2$, formed over the array 801 in accordance with the embodiment described above in connection with FIGS. 6A-7E. FIG. 8A is a cross-sectional SEM image of the array 801 after deposition of the dielectric layer 809 (i.e., LTO). FIG. 8B is a SEM image of a p contact area, viewed at an angle, after deposition a metal contact pad 831 with the photoresist stripped. FIG. 8C is a cross-sectional SEM image of a p contact area outside of the metal contact pad. As shown in FIG. 8C, the p contact area is "flattened" relative to the nanowires 801, the dielectric layer 809 (LTO, such as $SiO_2$) insulates the underlying n-GaN layer 807 from the p-electrode layer 819 (ITO) above, and the p-electrode layer connects the metal contact 831 with the p-GaN shells of the nanowires 801.

Although the present invention is described in terms of nanowire LEDs, it should be appreciated that other nanowire based semiconductor devices, such as field effect transistors, diodes and, in particular, devices involving light absorption or light generation, such as, photodetectors, solar cells, laser, etc., can be implemented on any nanowire structures.

In addition, although several example embodiments are described and illustrated as a top emitting nanowire LED, where light is extracted in the direction from base to the tip of the nanowire, it will be understood that embodiments may also include bottom emitting nanowire LEDs. In general, the construction of a bottom emitting nanostructure entails providing reflective structure, such as a mirror, at or near i.e. adjacent the top portions of each individual light emitting nanoelement so as to direct the emitted light backwards through the buffer layer of the device. Bottom-emitting electrodes are described further in U.S. Patent Publication No. 2011/0309382, filed on Jun. 17, 2011 and PCT Application No. PCT/US 11/40932, filed Jun. 17, 2011, both of which are incorporated herein by reference in their entirety.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited.

The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of fabricating a semiconductor device, comprising:
    forming a plurality of nanowires on a support, wherein each nanowire comprises a first conductivity type semiconductor core and a second conductivity type semiconductor shell over the core;
    forming an insulating material layer over at least a portion of the plurality of nanowires such that at least a portion of the insulating material layer provides a substantially planar top surface;
    removing a portion of the insulating material layer to define an active region of nanowires;
    forming an electrical contact over the substantially planar top surface of the insulating material layer; and
    forming a conductive material layer over at least a portion of the insulating material layer and the plurality of nanowires in the active region,
    wherein the electrical contact is electrically connected to the conductive material layer; and
    wherein the conductive material layer contacts the nanowires in the active region and contacts the insulating material layer over the substantially planar top surface, wherein the electrical contact is formed on the conductive material.

2. The method of claim 1, wherein the device comprises a nanowire LED.

3. The method of claim 2, wherein the first conductivity type semiconductor core and the second conductivity type semiconductor shell are configured to form a pn or pin junction that in operation provides an active region for light generation.

4. The method of claim 1, wherein forming the insulating material comprises depositing the insulating material using a low temperature oxide (LTO) deposition process.

5. The method of claim 4, wherein the insulating material is deposited at a temperature less than about 750° C.

6. The method of claim 4, wherein the insulating material is deposited by chemical vapor deposition (CVD).

7. The method of claim 4, wherein the insulating material comprises $Al_2O_3$ or $SiO_2$.

8. The method of claim 1, wherein removing a portion of the insulating material layer comprises etching the insulating material layer through a mask.

9. The method of claim 8, wherein the etching removes the insulating material layer from the active region without etching the nanowires.

10. The method of claim 8, wherein the insulating material is wet etched.

11. The method of claim 10, wherein the insulating material is wet etched using a hydrofluoric acid solution.

12. The method of claim 1, further comprising maintaining a portion of the insulating material to provide a boundary around the active region of nanowires.

13. The method of claim 1, wherein removing a portion of the insulating material layer comprises etching the insulating material layer through a first mask to define the active region of nanowires, the method further comprising:
   etching through a second mask to remove nanowires and a portion of the conductive material layer to expose a portion of the support;
   forming a third mask over the device having a first opening over the conductive material layer and over the planar top surface of the insulating material layer and a second opening over the exposed portion of the support;
   depositing a metal material within the first opening to form the electrical contact electrically connected to the conductive material layer;
   depositing a metal material within the second opening to form the second electrical contact over the exposed portion of the support; and
   removing the third mask.

14. The method of claim 13, further comprising:
   forming a passivation layer over the active region of the device.

15. The method of claim 14, wherein the passivation material comprises photosensitive epoxy.

16. The method of claim 13, wherein the metal material comprises one or more of aluminum, titanium and gold.

17. The method of claim 1, further comprising:
   removing a first plurality of nanowires outside of the active region to provide a first substantially flat portion prior to forming the insulating material layer, wherein the substantially planar top surface of the insulating material layer is located over the first substantially flat portion.

18. The method of claim 17, further comprising:
   removing a second plurality of nanowires outside the active region to provide a second substantially flat portion, wherein the second electrical contact is formed in the second substantially flat portion.

19. The method of claim 18, wherein removing the first plurality of nanowires and the second plurality of nanowires to provide the respective first and second substantially flat portions comprises etching the nanowires through a first mask, and wherein removing a portion of the insulating material layer comprises etching the insulating material layer through a second mask to define the active region of nanowires, the method further comprising:
   etching the conductive material layer and the insulating material layer through a third mask to provide the exposed portion of the support;
   forming a fourth mask over the device having a first opening over the planar top surface of the insulating material layer and a second opening over the exposed portion of the support;
   depositing a metal material within the first opening to form the electrical contact electrically connected to the conductive material layer;
   depositing a metal material within the second opening to form the second electrical contact over the exposed portion of the support; and
   removing the fourth mask.

20. The method of claim 19, further comprising:
   forming a passivation layer over the active region of the device.

21. The method of claim 20, wherein the passivation material comprises an epoxy-based photoresist.

22. The method of claim 19, wherein the metal material comprises one or more of aluminum, titanium and gold.

23. A method of fabricating a semiconductor device, comprising:
   forming a plurality of nanowires on a support, wherein each nanowire comprises a first conductivity type semiconductor core and a second conductivity type semiconductor shell over the core;
   forming an insulating material layer over at least a portion of the plurality of nanowires such that at least a portion of the insulating material layer provides a substantially planar top surface;
   removing a portion of the insulating material layer to define an active region of nanowires;
   forming an electrical contact over the substantially planar top surface of the insulating material layer;
   forming a conductive material layer over at least a portion of the insulating material layer and the plurality of nanowires in the active region, wherein the electrical contact is electrically connected to the conductive material layer;
   removing nanowires and a portion of the conductive material layer to expose a portion of the support; and
   forming a second electrical contact over the exposed portion of the support.

24. A method of fabricating a semiconductor device, comprising:
   forming a plurality of nanowires on a support, wherein each nanowire comprises a first conductivity type semiconductor core and a second conductivity type semiconductor shell over the core;
   forming an insulating material layer over at least a portion of the plurality of nanowires such that at least a portion of the insulating material layer provides a substantially planar top surface;
   removing a portion of the insulating material layer to define an active region of nanowires;
   forming an electrical contact over the substantially planar top surface of the insulating material layer; and
   forming a conductive material layer over at least a portion of the insulating material layer and the plurality of nanowires in the active region,
   wherein the electrical contact is electrically connected to the conductive material layer;
   wherein the device comprises a nanowire LED; and
   wherein the conductive material layer comprises a transparent conductive oxide (TCO).

25. The method of claim 24, wherein the TCO comprises indium tin oxide (ITO).

* * * * *